(12) United States Patent
Herman et al.

(10) Patent No.: US 8,513,720 B2
(45) Date of Patent: Aug. 20, 2013

(54) METAL OXIDE SEMICONDUCTOR THIN FILM TRANSISTORS

(75) Inventors: Gregory S. Herman, Camas, WA (US); Jer-shen Maa, Vancouver, WA (US); Kanan Puntambekar, Hillsboro, OR (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 276 days.

(21) Appl. No.: 12/836,217

(22) Filed: Jul. 14, 2010

(65) Prior Publication Data

US 2012/0012835 A1 Jan. 19, 2012

(51) Int. Cl.
*H01L 21/02* (2006.01)
*H01L 29/66* (2006.01)

(52) U.S. Cl.
USPC .... 257/289; 257/352; 257/353; 257/E29.151; 438/151; 438/158

(58) Field of Classification Search
USPC ......... 257/289, 352, 353, E29.151; 438/151, 438/158
See application file for complete search history.

(56) References Cited

U.S. PATENT DOCUMENTS

| | | | |
|---|---|---|---|
| 7,067,843 B2 | 6/2006 | Carcia et al. | |
| 7,242,039 B2 | 7/2007 | Hoffman et al. | |
| 7,282,782 B2 | 10/2007 | Hoffman et al. | |
| 7,297,977 B2 | 11/2007 | Hoffman et al. | |
| 7,309,895 B2 | 12/2007 | Hoffman et al. | |
| 8,053,773 B2 * | 11/2011 | Shin et al. | 257/43 |
| 2006/0108636 A1 | 5/2006 | Sano et al. | |
| 2006/0113539 A1 | 6/2006 | Sano et al. | |
| 2011/0315936 A1 * | 12/2011 | Inoue et al. | 252/512 |
| 2012/0018713 A1 * | 1/2012 | Moon et al. | 257/40 |
| 2012/0052636 A1 * | 3/2012 | Shin et al. | 438/151 |

OTHER PUBLICATIONS

J. Wager et al., "Transparent Electronics", Materials, Springer, 2007, pp. 56-71.
A.J. Freeman et , "Chemical and thin film strategies for new transparent conducting oxides", MRS Bulletin, Aug. 2000, pp. 45-51.
C. Warmsingh et at, "High-mobility transparent conducting Mo-doped In2O3 thin films by pulse laser deposition", Journal of Applied Physics, vol. 95, issue 7, pp. 3831-3833.

* cited by examiner

*Primary Examiner* — Ngan Ngo
(74) *Attorney, Agent, or Firm* — Law Office of Gerald Maliszewski; Gerald Maliszewski

(57) ABSTRACT

A top gate and bottom gate thin film transistor (TFT) are provided with an associated fabrication method. The TFT is fabricated from a substrate, and an active metal oxide semiconductor (MOS) layer overlying the substrate. Source/drain (S/D) regions are formed in contact with the active MOS layer. A channel region is interposed between the S/D regions. The TFT includes a gate electrode, and a gate dielectric interposed between the channel region and the gate electrode. The active MOS layer may be ZnOx, InOx, GaOx, SnOx, or combinations of the above-mentioned materials. The active MOS layer also includes a primary dopant such as H, K, Sc, La, Mo, Bi, Ce, Pr, Nd, Sm, Dy, or combinations of the above-mentioned dopants. The active MOS layer may also include a secondary dopant.

20 Claims, 3 Drawing Sheets

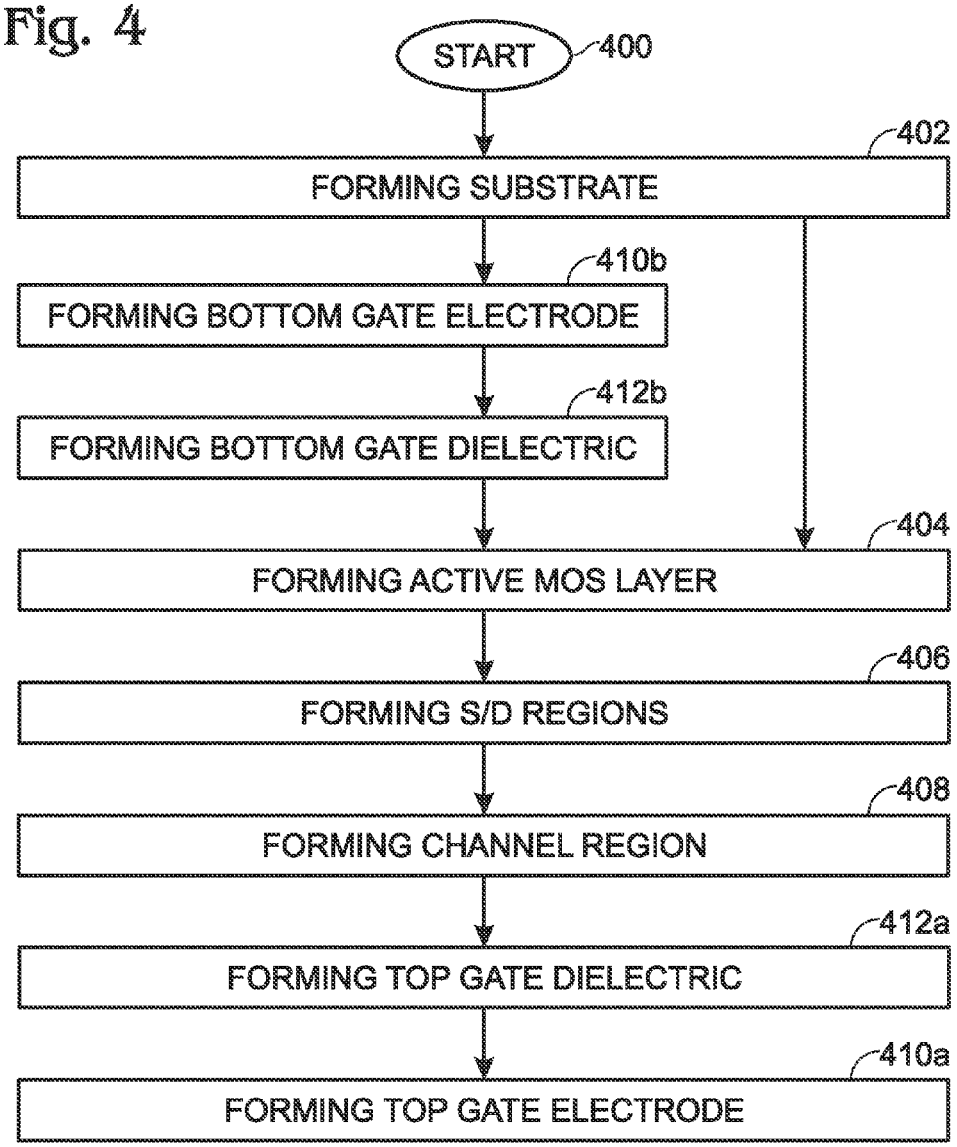

METAL OXIDE SEMICONDUCTOR THIN FILM TRANSISTORS

BACKGROUND OF THE INVENTION

1. Field of the Invention

This invention generally relates to integrated circuit (IC) and display backplane fabrication and, more particularly, to metal oxide semiconductor (MOS) thin film transistors made from doped of ZnOx, InOx, GaOx, and SnOx materials.

2. Description of the Related Art

Currently, a variety of materials are being used for oxide semiconductor based thin film transistors with metal oxide semiconductors (MOS) as the active semiconducting materials (see for example, "Transparent Electronics", J. Wager, D. Keszler, R. Presley, Springer, 2007). At this time, the primary materials of choice include ZnO and InGaZnOx. Very good electrical performance can be obtained for thin film transistors (TFT) devices fabricated with these materials. For example, InGaZnOx TFTs can be used to drive pixels for electrophoretic, liquid crystal display (LCD), and organic light emitting diode (OLED) displays.

It should also be noted that these MOS materials are very closely related to transparent conducting oxides (TCO) materials, although the MOS materials are semiconducting due to their low carrier concentrations. A key aspect of this technology is to precisely control carrier concentrations in these MOS materials so that they are not too conducting, so that they can be switched off.

In the case of ZnO, very tight control over deposition conditions is necessary to obtain the appropriate semiconducting film characteristics. Unfortunately, InGaZnOx films are expensive to fabricate due to the high cost of the In and Ga used in the films.

It would be advantageous if inexpensive MOS materials were available for the fabrication of TFTs.

SUMMARY OF THE INVENTION

Described herein is a method for modifying an oxide semiconductor film composition with the desired result of reducing costly elements, improving performance, and creating a larger processing space window. The oxide semiconductor films mentioned below incorporate a variety of elements into the films that help control carrier concentrations.

Accordingly, a top gate thin film transistor (TFT) is provided. The TFT is fabricated from a substrate, and an active metal oxide semiconductor (MOS) layer overlying the substrate. Source/drain (S/D) regions are formed in contact with the active MOS layer. A channel region is interposed between the S/D regions. The TFT includes a gate electrode, and a gate dielectric interposed between the channel region and the gate electrode. The active MOS layer may be ZnOx, InOx, GaOx, SnOx, or combinations of the above-mentioned materials. For example, the active MOS layer may be ZnSnOx, InGaZnOx, ZnInOx, or InGaOx. The active MOS layer includes a primary dopant such as H, K, Sc, La, Mo, Bi, Ce, Pr, Nd, Sm, Dy, or combinations of the above-mentioned dopants. In another aspect, the active MOS layer includes a secondary dopant such as Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, or combinations of the above-mentioned dopants.

Additional details of the above-described top gate TFT, as well as a bottom gate TFT and associated fabrication methods are provided below.

BRIEF DESCRIPTION OF THE DRAWINGS

FIG. 4 is a flowchart illustrating a method for forming a TFT.

DETAILED DESCRIPTION

Figure 1:
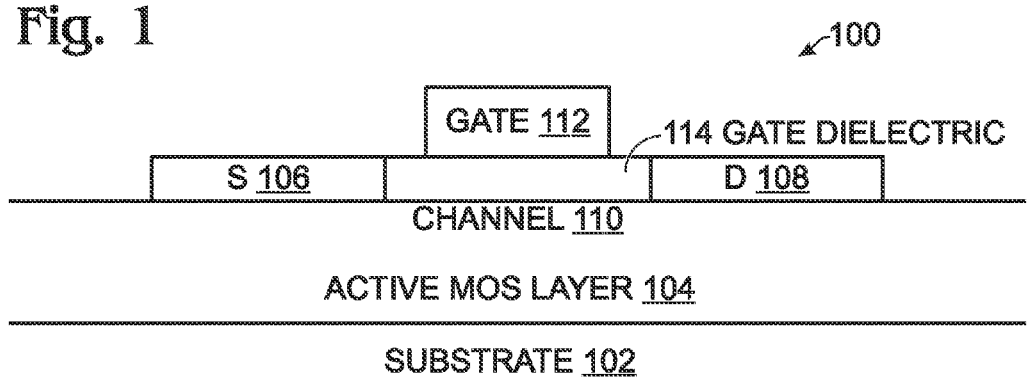
FIG. 1 is a partial cross-sectional view of a top gate thin film transistor (TFT).

FIG. 1 is a partial cross-sectional view of a top gate thin film transistor (TFT). The top gate TFT 100 comprises a substrate 102 made from a semiconductor material, such as silicon, or transparent material, such as glass, quartz, or plastic. An active metal oxide semiconductor (MOS) layer 104 overlies the substrate 102. The active MOS layer 104 is a material such as ZnOx, InOx, GaOx, SnOx, or combinations of the above-mentioned materials. For example, the active MOS layer 104 may be ZnSnOx, InGaZnOx, ZnInOx, or InGaOx. The active MOS layer 104 also includes a primary dopant of H, K, Sc, La, Mo, Bi, Ce, Pr, Nd, Sm, Dy, or combinations of the above-mentioned dopants. In one aspect, the primary dopant is H, Mo, or a combination of H and Mo. In another aspect, the active MOS layer 104 is InGaZnOx and the primary dopant is Mo.

Source/drain (S/D) regions 106 and 108, respectively, are formed in contact with the active MOS layer 104. In one aspect, S/D regions 106/108 may be metal electrodes. In another aspect, the S/D regions 106/108 may be formed from a highly doped combination of the oxide material (similar to TCO) making up the active MOS layer. A channel region 110 is interposed between the S/D regions 106/108. A gate electrode 112 overlies the channel region 110, and a gate dielectric 114 is interposed between the channel region 110 and the gate electrode 112.

In one aspect, the active MOS layer 104 includes a secondary dopant such as Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, or combinations of the above-mentioned dopants.

Figure 2:
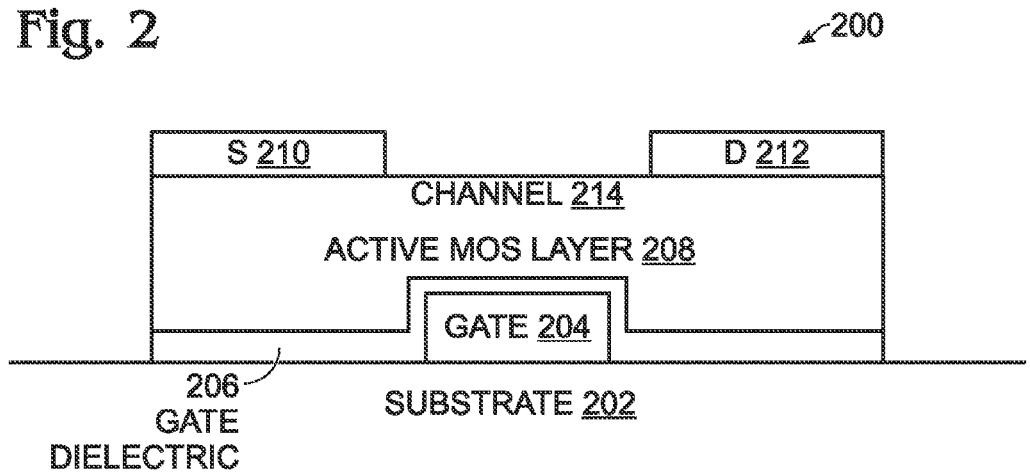
FIG. 2 is a partial cross-sectional view of a bottom gate TFT.

FIG. 2 is a partial cross-sectional view of a bottom gate TFT. The bottom gate TFT 200 comprises a substrate 202 made from a semiconductor material, such as silicon, or transparent material, such as glass, quartz, or plastic. A gate electrode 204 overlies the substrate 202, made from a metal or doped semiconductor. A gate dielectric 206 overlies the gate electrode 204. An active MOS layer 208 overlies the gate dielectric 206. S/D regions 210 and 212, respectively, are in contact with the active MOS layer 208. A channel region 214 is formed in the active MOS layer 208, interposed between the S/D regions 210/212.

As with the top gate TFT of FIG. 1, the active MOS layer 208 is made from ZnOx, InOx, GaOx, SnOx, or combinations of these materials, with a primary dopant of H, K, Sc, La, Mo, Bi, Ce, Pr, Nd, Sm, Dy, and combinations of the above-mentioned dopants. In one aspect, the active MOS layer 208 is a material such as ZnSnOx, InGaZnOx, ZnInOx, and InGaOx. The primary dopants H, Mo, and a combination of H and Mo are especially useful, especially an active MOS layer of InGaZnOx with a primary dopant of Mo.

As with the top gate TFT, the active MOS layer 208 may include a secondary dopant such as Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, or combinations of the above-mentioned dopants.

Other transistor and device structures made with an active MOS layer are well known in the art, and are not presented in the interest of brevity.

FUNCTIONAL DESCRIPTION

It has been previously been shown that high quality thin film transistors can be fabricated using base oxide semiconductor materials including ZnO, $In_2O_3$, $Ga_2O_3$, and $SnO_2$, and mixtures thereof. Although there has been considerable coverage of adjacent materials space, research continues into elements suitable for transparent conducting oxide (TCO) applications. A review of the properties and materials space covered by TCOs can be found in A. J. Freeman et al., MRS Bulletin, August 2000 pp. 45-51.

The transistors described in FIGS. 1 and 2 cover the base oxide semiconductor materials including ZnO, $Ga_2O_3$, $Ga_2O_3$, and $SnO_2$, and combinations thereof, and the addition of dopants including the following elements, either by themselves or in multiple combinations, H, K, Sc, La, Mo, Bi, Ce, Pr, Nd, Sm, and Dy. These elements have been investigated in the past as dopants in TCO applications. Typically, however, these elements have not been routinely used, in part due to the higher resistivities compared to ITO. Of course, the goal for thin film transistor applications is to have high resistivities to reduce the off current of the devices, and still have high mobilities.

Figure 3:
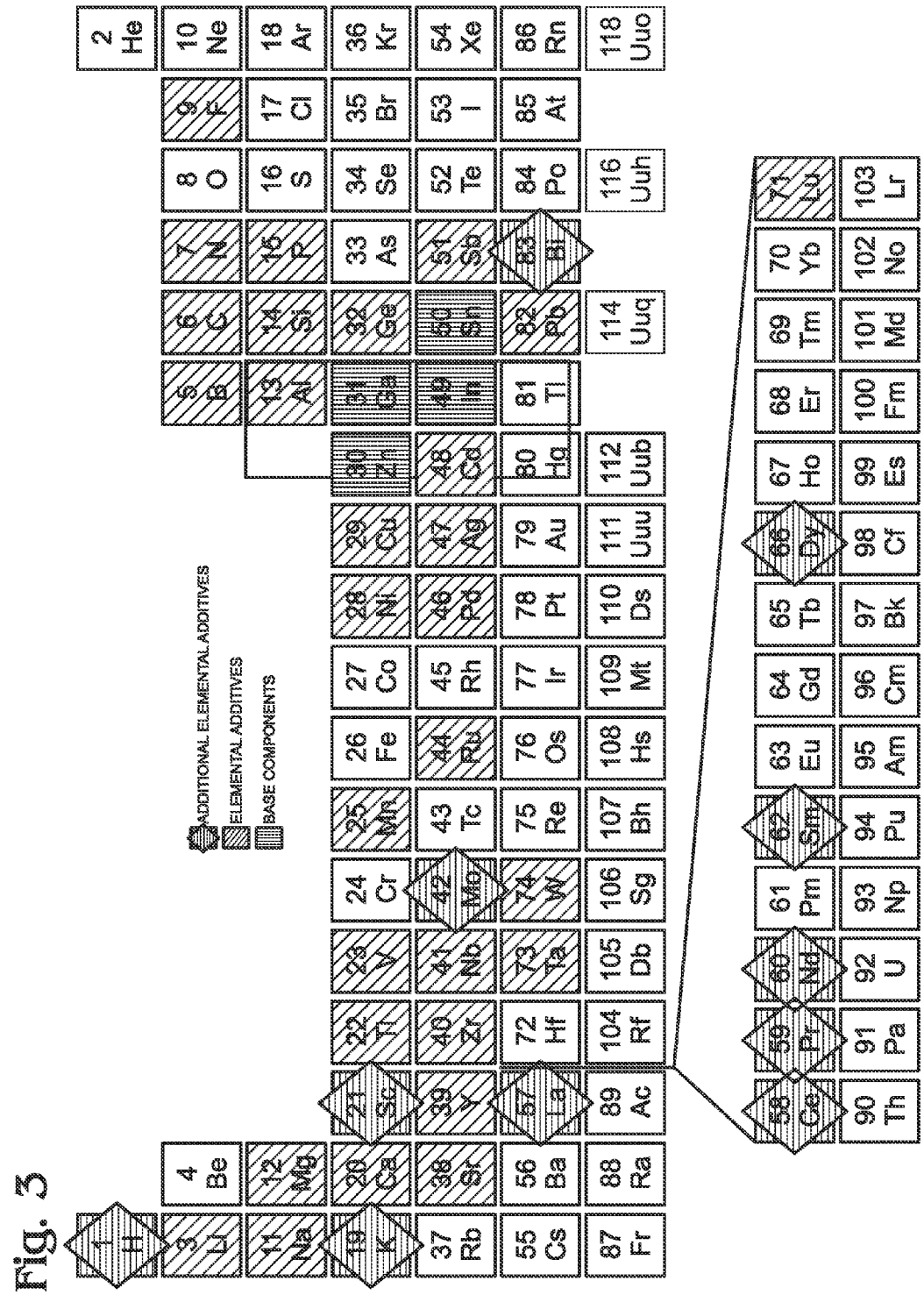
FIG. 3 is a diagram of the Periodic Table showing a summary of base components, elemental additives already known in the prior art, and novel additional elemental additives for use in oxide semiconductor based thin film transistors of FIGS. 1 and 2.

FIG. 3 is a diagram of the Periodic Table showing a summary of base components, elemental additives already known in the prior art, and novel additional elemental additives for use in oxide semiconductor based thin film transistors of FIGS. 1 and 2.

In one aspect, InGaZnOx and ZnSnOx can be doped with Mo and/or H. Both Mo and H are electron donors in oxide semiconductors, and the precise control over these two elements can allow optimal control over TFT performance. One benefit related to H doping is that the partial pressure of $H_2$ and/or $H_2O$ can be varied during the deposition. For example, for bottom gate devices the partial pressure of $H_2$ and/or $H_2O$ can be increased so that one has higher electron carrier concentrations at the semiconductor/dielectric interface. Then, the partial pressure can be reduced for the remainder of the deposition to limit the electron carrier concentration in the bulk of the film. Typically higher electron carrier concentrations also lead to higher effective mobilities of these materials. An example of a high electron mobility TCO is $In_2O_3$:Mo which can have mobilities as high as 95 $cm^2/Vs$ (see, "High-mobility transparent conducting Mo-doped $In_2O_3$ thin films by pulsed laser deposition," C. Warmsingh et al., JOURNAL OF APPLIED PHYSICS, Vol. 95, Issue: 7, Pages: 3831-3833, Published: APR 1 2004). These same advantages also apply in the use of the other primary dopants mentioned above.

A secondary focus is the use of the following elements, either by themselves or in multiple combinations. H, K, Sc, La, Mo, Bi, Ce, Pr, Nd, Sm, and Dy can be used to co-dope the base oxide semiconductor materials, including ZnO, $In_2O_3$, $Ga_2O_3$, and $SnO_2$, and combinations thereof, in addition to the dopants already well known in the art (e.g., Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, and combinations thereof).

The use of the above-mentioned dopants for purposes of the forming a MOS layer is novel, as these materials are typically understood to be a TCO layer. In addition, these dopants permit the formation of a gradient doping (as opposed to a blanket doping) through the active MOS layer.

FIG. 4 is a flowchart illustrating a method for forming a TFT. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 400.

Step 402 forms a substrate. Step 404 forms an active MOS layer overlying the substrate, from ZnOx, InOx, GaOx, SnOx, or combinations of the above-mentioned materials, including a primary dopant of H, K, Sc, La, Mo, Bi, Ce, Pr, Nd, Sm, Dy, or combinations of the above-mentioned dopants. In one aspect, Step 404 forms the active MOS layer with a secondary dopant of Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, or combinations of the above-mentioned dopants. The active MOS layer is deposited using a vacuum-based deposition technique such as dc sputtering, RF sputtering, magnetron sputtering, or ion beam sputtering.

Alternately, Step 404 forms the active MOS layer using a solution-based deposition technique, such as blanket spin-coating or patterned printing techniques, followed by an anneal process.

In one aspect, Step 404 introduces the primary dopant through implantation, or sputtering with a target modified to include the dopants. Alternately, the primary dopant is introduced through the use of an additional film including the dopant, deposited on either the top or bottom active MOS layer surface, followed by an annealing step to diffuse the dopant through the bulk of the active MOS layer. The additional film can be deposited using a vacuum or non-vacuum based technique.

The annealing step diffuses the dopant through the bulk of the film. The annealing can be performed using thermal annealing, or a laser annealing process. The annealing process provides the ability to control the area and extent of diffusion discretely in different regions of the film. It can tailored to provide a specific doping profile through the thickness of the film in order to create more electron rich regions at the gate dielectric interface with decreasing concentration away from this interface in order to restrict the conduction channel region in the operation device near the dielectric interface and maintain low off currents.

In another variation, the primary dopant is introduced as a gas or an element of a gas at a first partial pressure to create a first electron carrier concentration at an interface of the active MOS layer and gate dielectric layer. Subsequently, the primary dopant is introduced at a second partial pressure, less than the first partial pressure, to create a second electron carrier concentration, less than the first electron carrier concentration, in the bulk of the active MOS layer away from the interface.

In one aspect, a combination of the primary and secondary dopants are introduced by implantation, or by sputtering with a target modified to include the dopants and implantation. In another aspect, the combination of primary and secondary dopants is introduced through the use of an additional film including the dopants. This additional film can be placed on either the top or bottom active MOS layer surface, followed by an annealing step to diffuse the dopant through the bulk of the active MOS layer.

Step 406 forms source/drain (S/D) regions in contact with the active MOS layer. Step 408 forms a channel region interposed between the S/D regions. Step 410 forms either a top gate electrode or bottom gate electrode. Step 412 forms a gate dielectric interposed between the channel region and the gate electrode.

In the case of a top gate electrode, Step 410a, and 412a are performed after Step 404. Specifically, Step 412a is performed before Step 410*a*. In the case of a bottom gate electrode, Steps 410*b* and 412*b* are performed before Step 404.

Particular process steps and device structures have been presented as examples to illustrate the invention. However, the invention is not limited to just these examples. Other variations and embodiments of the invention will occur to those skilled in the art.

We claim:

1. A top gate thin film transistor (TFT) comprising:
a substrate;
an active metal oxide semiconductor (MOS) layer overlying the substrate;
source/drain (SID) regions in contact with the active MOS layer;
a channel region interposed between the S/D regions;
a gate electrode;
a gate dielectric interposed between the channel region and the gate electrode; and,
wherein the active MOS layer is selected from a group consisting of InOx, GaOx, SnOx, and combinations of the above-mentioned materials, and includes a primary dopant selected from a group consisting of H, K, Sc, La, Mo, Bi, Ce, Pr, Nd, Sm, and combinations of the above-mentioned dopants.

2. The top gate TFT of claim 1 wherein the active MOS layer is InGaOx.

3. The top gate TFT of claim 2 wherein the primary dopant is selected from a group consisting of H, Mo, and a combination of H and Mo.

4. The top gate TFT of claim 1 wherein the active MOS layer includes a secondary dopant selected from a group consisting of Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, and combinations of the above-mentioned dopants.

5. A bottom gate thin film transistor (TFT) comprising:
a substrate;
a gate electrode overlying the substrate;
a gate dielectric overlying the gate electrode;
an active metal oxide semiconductor (MOS) layer overlying the gate dielectric;
source/drain (S/D) regions in contact with the active MOS layer;
a channel region formed in the active MOS layer, interposed between the S/D regions; and,
wherein the active MOS layer is selected from a group consisting of InOx, GaOx, SnOx, and combinations of the above-mentioned materials, with a primary dopant selected from a group consisting of H, K, Sc, La, Mo, Bi, Ce, Pr, Nd, Sm, and combinations of the above-mentioned dopants.

6. The bottom gate TFT of claim 5 wherein the active MOS layer is InGaOx.

7. The bottom gate TFT of claim 6 wherein the primary dopant is selected from a group consisting of H, Mo, and a combination of H and Mo.

8. The bottom gate TFT of claim 5 wherein the active MOS layer includes a secondary dopant selected from a group consisting of Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, and combinations of the above-mentioned dopants.

9. A method for forming a thin film transistor (TFT) comprising:
forming a substrate;
forming an active metal oxide semiconductor (MOS) layer overlying the substrate, selected from a group of materials consisting of ZnOx, InOx, GaOx, SnOx, and combinations of the above-mentioned materials, including a primary dopant selected from a group consisting of H, K, Sc, La, Mo, Bi, Ce, Pr, Nd, Sm, Dy, and combinations of the above-mentioned dopants, and including a secondary dopant selected from a group consisting of Li, Na, Mg, Ca, Sr, Y, Ti, Zr, V, Nb, Ta, W, Mn, Ru, Ni, Pd, Cu, Ag. Cd, Ph, Ge, Si, C, B, Al, N, P, Sb, F, and combinations of the above-mentioned dopants;
forming source/drain (S/D) regions in contact with the active MOS layer;
forming a channel region interposed between the S/D regions;
forming a gate electrode selected from a group consisting of a top gate electrode and a bottom gate electrode; and,
forming a gate dielectric interposed between the channel region and the gate electrode.

10. The method of claim 9 wherein forming the active MOS layer includes using a vacuum-based deposition technique selected from a group consisting of dc sputtering, RF sputtering, magnetron sputtering, and ion beam sputtering.

11. The method of claim 9 wherein forming the active MOS layer includes using a solution-based deposition technique, selected from a group consisting of blanket spin-coating and patterned printing techniques, followed by an anneal process.

12. The method of claim 9 wherein forming the active MOS layer includes introducing a combination of the primary dopant and the secondary dopant using a method selected from a group consisting of sputtering with a target modified to include the dopants and implantation.

13. The method of claim 9 wherein forming the active MOS layer includes introducing a combination of the primary dopant and the secondary dopant by the deposition of an additional film including the dopants, on a surface selected from a group consisting of a top and a bottom active MOS layer surface, followed by an annealing step to diffuse the dopant through the bulk of the active MOS layer.

14. The method of claim 9 wherein forming the active MOS layer includes introducing the primary dopant using a method selected from a group consisting of sputtering with a target modified to include the dopants and implantation.

15. The method of claim 9 wherein forming the active MOS layer includes introducing the primary dopant by the deposition of an additional film including the dopant, on a surface selected from a group consisting of a top and a bottom active MOS layer surface, followed by an annealing step to diffuse the dopant through the hulk of the active MOS layer.

16. The method of claim 9 wherein forming the active MOS layer includes;
introducing a primary dopant as an element of a gas to the previously deposited active MOS layer at a first partial pressure to create a first electron carrier concentration at an interface of the active MOS layer and gate dielectric layer; and,
introducing the primary dopant at a second partial pressure, less than the first partial pressure, to create a second electron carrier concentration, less than the first electron carrier concentration, in the active MOS layer away from the interface.

17. A top gate thin film transistor (TFT) comprising:
a substrate;
an active metal oxide semiconductor (MOS) layer overlying the substrate;
source/drain (SD) regions in contact with the active MOS layer;
a channel region interposed between the SID regions;
a gate electrode;

a gate dielectric interposed between the channel region and the gate electrode; and, wherein the active MOS layer is InGaZnOx with a primary dopant of Mo.

18. A top gate thin film transistor (TFT) comprising:
a substrate;
an active metal oxide semiconductor (MOS) layer overlying the substrate;
source/drain (SiD) regions in contact with the active MOS layer;
a channel region interposed between the S/D regions;
a gate electrode;
a gate dielectric interposed between the channel region and the gate electrode;
wherein the active MOS layer is selected from a group consisting of ZnOx, InOx, GaOx, SnOx, and combinations of the above-mentioned materials, and includes a primary dopant selected from a group consisting of H, K, Sc, La, Mo, Bi, Ce, Pr, Nd, Sm, Dy, and combinations of the above-mentioned dopants; and,
wherein the active MOS layer includes a secondary dopant selected from a group consisting of Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, and combinations of the above-mentioned dopants.

19. A bottom gate thin film transistor (TFT) comprising:
a substrate;
a gate electrode overlying the substrate;
a gate dielectric overlying the gate electrode;
an active metal oxide semiconductor (MOS) layer overlying the gate dielectric;
source/drain (S/D) regions in contact with the active MOS layer;
a channel region formed inn the active MOS layer, interposed between the S/D regions; and,
wherein the active MOS layer is InGaZnOx with a primary dopant of Mo.

20. A bottom gate thin film transistor (TFT) comprising:
a substrate;
a gate electrode overlying the substrate;
a gate dielectric overlying the gate electrode;
an active metal oxide semiconductor (MOS) layer overlying the gate dielectric;
source/drain (S/D) regions in contact with the active MOS layer;
a channel region formed in the active MOS layer, interposed between the S/D regions;
wherein the active MOS layer is selected from a group consisting of ZnOx, InOx, GaOx, SnOx, and combinations of the above-mentioned materials, with a primary dopant selected from a group consisting of H, K, Sc, La, Mo, Bi, Ce, Pr, Nd, Sm, Dy, and combinations of the above-mentioned dopants; and,
wherein the active MOS layer includes a secondary dopant selected from a group consisting of Li, Na, Mg, Ca, Sr, Y. Ti, Zr, V, Nb, Ta, W, Mn, Ru, Ni, Pd, Cu, Ag, Cd, Pb, Ge, Si, C, B, Al, N, P, Sb, F, and combinations of the above-mentioned dopants.

* * * * *

UNITED STATES PATENT AND TRADEMARK OFFICE
CERTIFICATE OF CORRECTION

PATENT NO. : 8,513,720 B2
APPLICATION NO. : 12/836217
DATED : August 20, 2013
INVENTOR(S) : Gregory Herman et al.

It is certified that error appears in the above-identified patent and that said Letters Patent is hereby corrected as shown below:

In the Claims:

In claim 9, column 6, line 6, the element "Pb" has been incorrectly printed as "Ph". Claim 9 should be printed as follows:

9. A method for forming a thin film transistor (TFT) comprising:
forming a substrate;
forming an active metal oxide semiconductor (MOS) layer overlying the substrate, selected from a group of materials consisting of $ZnO_x$, $InO_x$, $GaO_x$, $SnO_x$, and combinations of the above-mentioned materials, including a primary dopant selected from a group consisting of H, K, Sc, La, Mo, Bi, Ce, Pr, Nd, Sm, Dy, and combinations of the above-mentioned dopants, and including a secondary dopant selected from a group consisting of Li, Na, Mg, Ca, Sr, Y, Ti, Zr, V, Nb, Ta, W, Mn, Ru, Ni, Pd, Cu, Ag, Cd, Pb, Ge, Si, C, B, Al, N, P, Sb, F, and combinations of the above-mentioned dopants;
forming source/drain (S/D) regions in contact with the active MOS layer;
forming a channel region interposed between the S/D regions;
forming a gate electrode selected from a group consisting of a top gate electrode and a bottom gate electrode; and,
forming a gate dielectric interposed between the channel region and the gate electrode.

In claim 15, column 6, line 47, the word "bulk" has been incorrectly printed as "hulk". Claim 15 should be printed as follows:

15. The method of claim 9 wherein forming the active MOS layer includes introducing the primary dopant by the deposition of an additional film including the dopant, on a surface selected from a group consisting of a top and a bottom active MOS layer surface, followed by an annealing step to diffuse the dopant through the bulk of the active MOS layer.

Signed and Sealed this
Nineteenth Day of November, 2013

Teresa Stanek Rea
*Deputy Director of the United States Patent and Trademark Office*